(12) United States Patent
Bojer

(10) Patent No.: US 10,147,530 B2
(45) Date of Patent: Dec. 4, 2018

(54) TUNING SYSTEMS, DEVICES AND METHODS

(71) Applicant: Wispry, Inc., Irvine, CA (US)

(72) Inventor: Jorgen Bojer, Vadum (DK)

(73) Assignee: WISPRY, INC., Irvine, CA (US)

( * ) Notice: Subject to any disclaimer, the term of this patent is extended or adjusted under 35 U.S.C. 154(b) by 0 days.

(21) Appl. No.: 14/216,504

(22) Filed: Mar. 17, 2014

(65) Prior Publication Data

US 2014/0285299 A1 Sep. 25, 2014

Related U.S. Application Data

(60) Provisional application No. 61/794,982, filed on Mar. 15, 2013.

(51) Int. Cl.
| | |
|---|---|
| *H01F 5/00* | (2006.01) |
| *H01F 21/02* | (2006.01) |
| *H01F 27/28* | (2006.01) |
| *H01F 27/40* | (2006.01) |
| *H03H 5/00* | (2006.01) |
| *H03H 5/12* | (2006.01) |

(52) U.S. Cl.
CPC .............. *H01F 21/02* (2013.01); *H01F 5/00* (2013.01); *H01F 27/2804* (2013.01); *H01F 27/40* (2013.01); *H03H 5/003* (2013.01); *H03H 5/12* (2013.01); *H01F 2027/2809* (2013.01)

(58) Field of Classification Search
CPC ......................... H01F 5/00; H01F 27/00–27/36
USPC .......................................... 336/65, 200, 232
See application file for complete search history.

(56) References Cited

U.S. PATENT DOCUMENTS

| | | | |
|---|---|---|---|
| 1,869,870 A * | 8/1932 | Stevenson ................. | H03H 7/01 333/175 |
| 2,512,945 A * | 6/1950 | Kallmann ............... | H03H 5/003 333/234 |

(Continued)

FOREIGN PATENT DOCUMENTS

| | | |
|---|---|---|
| CN | 102 237 172 A | 11/2011 |
| CN | 102 761 119 A | 10/2012 |

(Continued)

OTHER PUBLICATIONS

International Search Report for Application No. PCT/US2014/030492 dated Aug. 27, 2014.

(Continued)

*Primary Examiner* — Tuyen Nguyen
(74) *Attorney, Agent, or Firm* — Jenkins, Wilson, Taylor & Hunt, P.A.

(57) ABSTRACT

Systems and implementations for inductance tuning systems that are configured to operate in a wide range of frequencies are provided herein. The subject matter described herein can in some embodiments include an inductance tuning system including at least one inductor connected to a first terminal, the at least one inductor comprising of a plurality of inductive elements that are substantially magnetically coupled to each other, wherein spacing between the inductive elements are substantially less than diameters of the windings. At least one capacitor can be connected between one or more of the plurality of inductive elements and a second terminal.

15 Claims, 22 Drawing Sheets

(56) References Cited

U.S. PATENT DOCUMENTS

| | | | | |
|---|---|---|---|---|
| 2,601,338 A * | 6/1952 | Snyder | H01F 21/005 | 334/66 |
| 2,636,085 A * | 4/1953 | Boothby | H03H 5/02 | 324/76.51 |
| 3,163,782 A * | 12/1964 | Ross | H03K 3/57 | 327/304 |
| 3,217,275 A * | 11/1965 | Duncan, Jr. | H03H 7/40 | 333/100 |
| 3,436,687 A * | 4/1969 | Andrews, Jr. | H03H 7/32 | 333/140 |
| 3,487,339 A * | 12/1969 | Griepentrog | H04N 5/4446 | 333/176 |
| 3,693,117 A * | 9/1972 | Byrns | H03H 7/0161 | 333/81 R |
| 3,733,608 A * | 5/1973 | McGhay | H04B 1/50 | 333/132 |
| 3,769,616 A * | 10/1973 | Singh | H03H 5/003 | 333/175 |
| 4,090,140 A * | 5/1978 | Carter | H03K 17/52 | 327/181 |
| 4,482,816 A * | 11/1984 | Richardson | G01S 7/282 | 307/106 |
| 4,495,503 A | 1/1985 | Morman | | |
| 5,111,169 A * | 5/1992 | Ikeda | H03H 7/427 | 333/181 |
| 5,311,158 A * | 5/1994 | Asbeck | H03H 7/00 | 257/531 |
| 5,701,107 A * | 12/1997 | Kasahara | H03H 11/20 | 333/139 |
| 6,501,345 B2 * | 12/2002 | Ota | H01P 1/20381 | 333/134 |
| 6,762,655 B2 * | 7/2004 | Wichern | H03H 7/0115 | 333/175 |
| 7,183,880 B2 * | 2/2007 | Kamata | H03F 3/191 | 333/172 |
| 7,276,993 B2 * | 10/2007 | York | H03H 7/20 | 333/139 |
| 7,471,173 B2 * | 12/2008 | Hidaka | H01P 1/2084 | 333/1.1 |
| 7,528,795 B2 | 5/2009 | Schlager et al. | | |
| 8,576,026 B2 * | 11/2013 | Liu | H03H 7/09 | 333/204 |
| 8,791,775 B2 * | 7/2014 | Liu | H01L 23/5223 | 333/185 |
| 9,196,941 B2 * | 11/2015 | Chuang | H01P 1/20381 | |
| 2005/0116788 A1 * | 6/2005 | Matters-Kammerer | H03H 7/48 | 333/116 |
| 2010/0232474 A1 | 9/2010 | Rofougaran et al. | | |
| 2011/0175687 A1 * | 7/2011 | Morris | H03H 7/383 | 333/32 |
| 2011/0260819 A1 | 10/2011 | Yeh et al. | | |
| 2012/0242223 A1 | 9/2012 | Espiau et al. | | |
| 2013/0093045 A1 * | 4/2013 | Cho | H01L 23/5223 | 257/531 |
| 2014/0285299 A1 | 9/2014 | Bojer | | |

FOREIGN PATENT DOCUMENTS

| | | |
|---|---|---|
| CN | 102 857 191 A | 1/2013 |
| EP | 2 974 012 | 1/2016 |
| JP | H09 143715 A | 6/1997 |
| WO | WO 2014/145687 | 9/2014 |

OTHER PUBLICATIONS

Notice of Publication for European Application No. 14764528.7 dated Dec. 23, 2015.
Extended European Search Report for Application No. 14764528 dated Oct. 20, 2016.
Chinese Office Action for Application No. 201480027311.5 dated Mar. 22, 2017.
Chinese Notice of Issuance for Chinese Application No. 201480027311.5 dated Dec. 6, 2017.

* cited by examiner

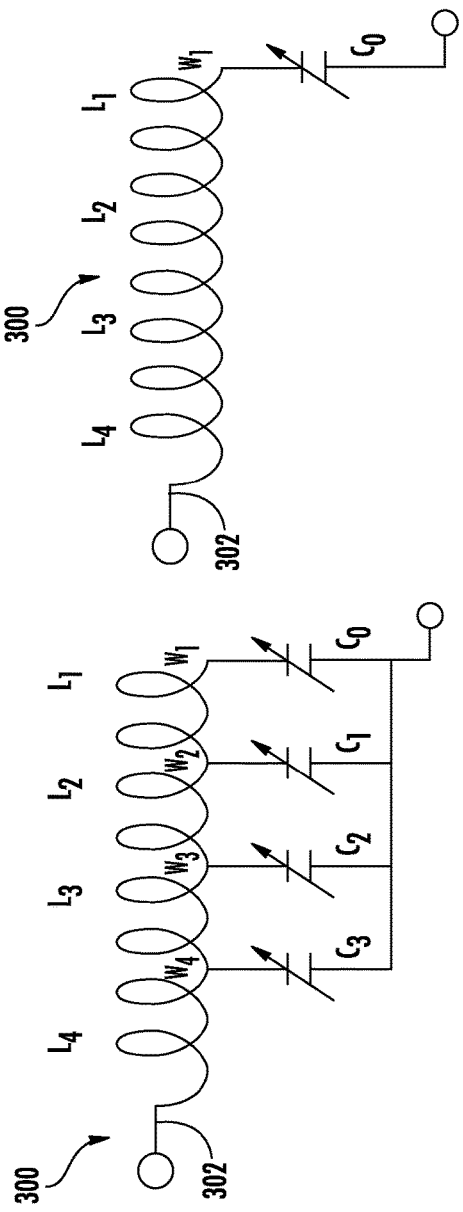
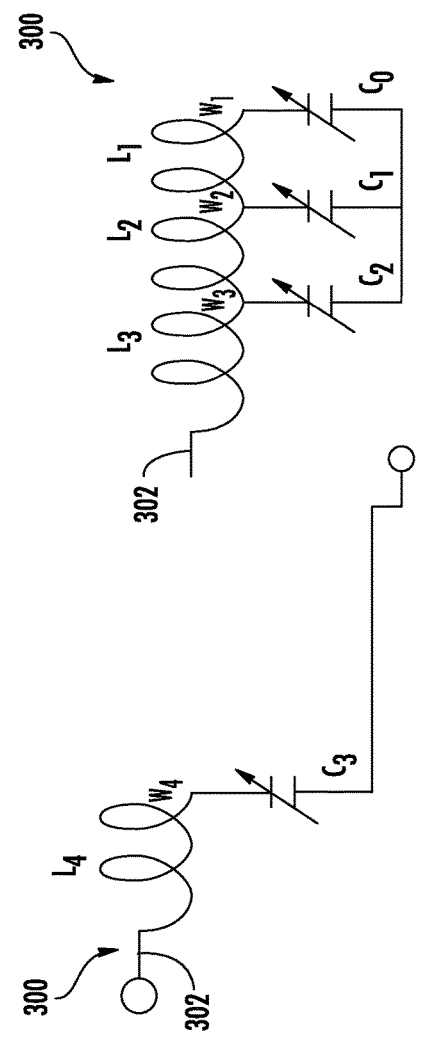
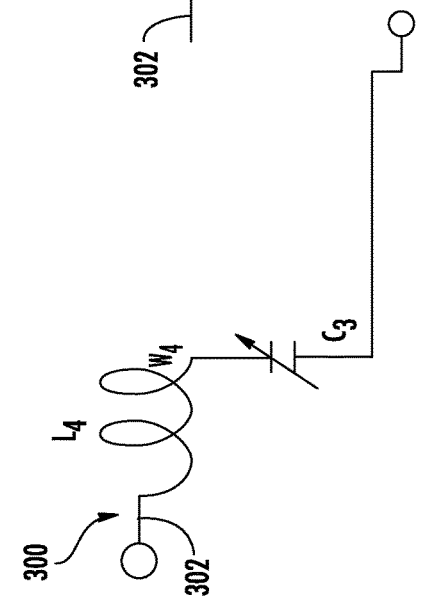
FIG. 3A
FIG. 3B
FIG. 3C
FIG. 3D

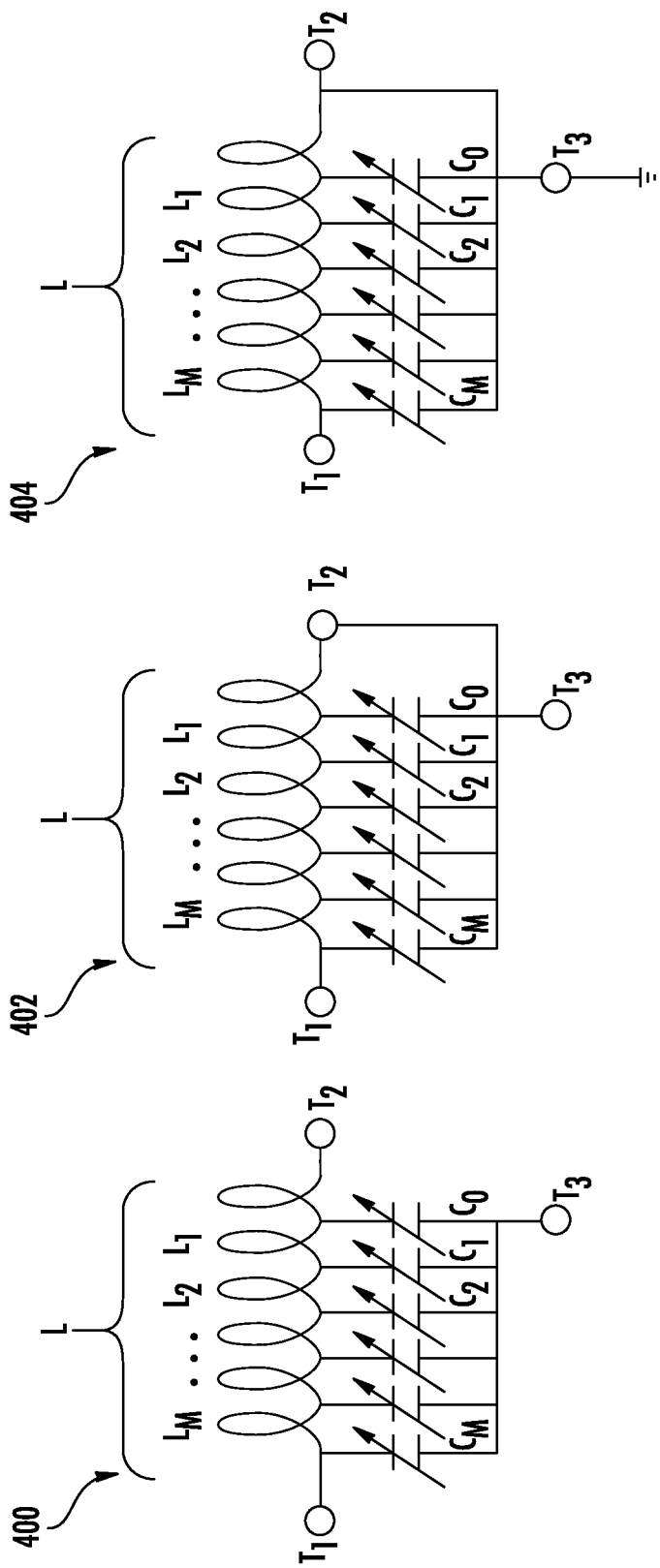

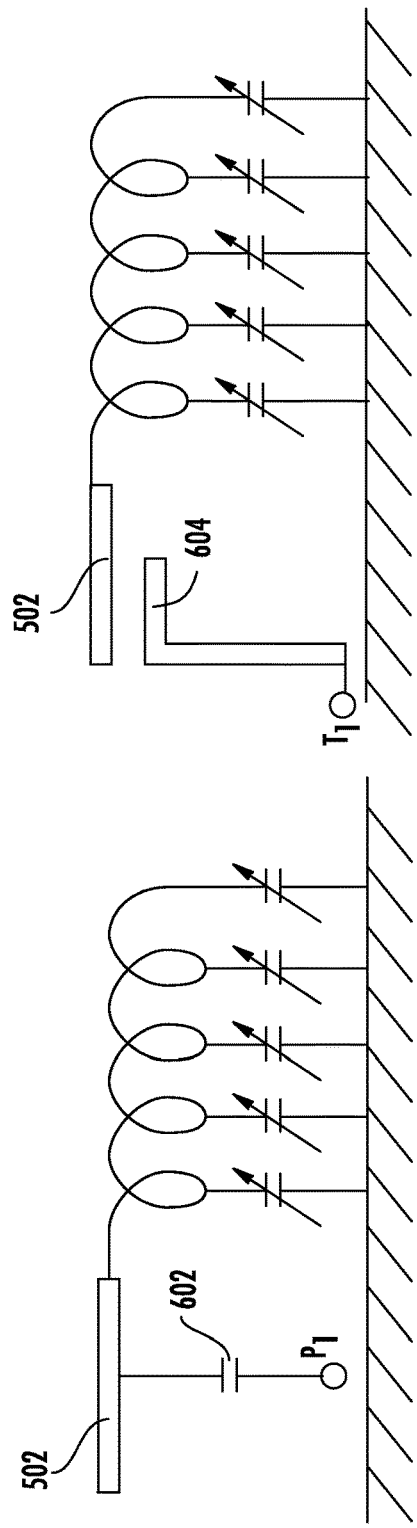
FIG. 6A
FIG. 6B
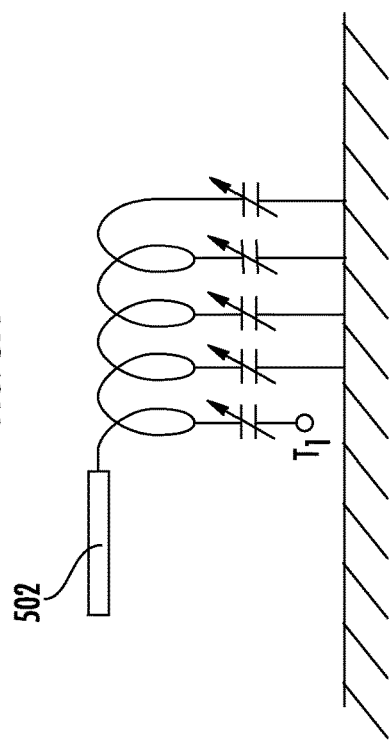
FIG. 6C

TUNING SYSTEMS, DEVICES AND METHODS

PRIORITY CLAIM

The present application claims the benefit of U.S. Provisional Patent Application Ser. No. 61/794,982, filed Mar. 15, 2013, the disclosure of which is incorporated herein by reference in its entirety.

TECHNICAL FIELD

The subject matter disclosed herein relates generally to operations and implementations of electrical inductors. More particularly, the subject matter disclosed herein relates to systems and implementations of operating tunable resonators.

BACKGROUND

For modern cellular communication systems, it is desirable to have handheld devices that can support multiple frequency bands (e.g., 3GPP, LTE bands). The ability to operate within multiple frequency bands have traditionally been achieved using devices such as fixed multi-resonance antennas. However, fixed multi-resonance antennas can be limited by the number of resonances they are able to achieve and the associated bandwidth of such resonances are not adequate to support a high number of frequency bands. In recent years, tunable single resonance antennas have also been utilized for supporting multi-band operations. However, tunable single resonance antennas have limited tuning ranges due to device component constraints. For example, tuning range can be limited by factors such as capacitance ratios between $C_{max}/C_{min}$ of the antenna or the ratio between series impedance values and shunt parasitic impedance values when one or more antennas are placed in a series configuration.

Accordingly, it would be desirable to implement systems for tuning inductance over a broader range of frequencies.

SUMMARY

In accordance with this disclosure, inductance tuning systems, devices, and methods are provided. In one aspect, an inductance tuning system can include at least one inductor connected to a first terminal, the at least one inductor comprising of a plurality of inductive elements that are substantially magnetically coupled to each other, wherein spacing between the inductive elements are substantially less than diameters of the windings. At least one capacitor can be connected between one or more of the plurality of inductive elements and a second terminal.

In another aspect, a method for tuning the inductance of an electrical resonator is provided. The method can include connecting at least one inductor to a first terminal, the at least one inductor comprising of a plurality of inductive elements that are substantially magnetically coupled to each other, wherein spacing between the inductive elements are substantially less than diameters of the windings. The method can further include connecting at least one capacitor between one or more of the plurality of inductive elements and a second terminal and selectively adjusting a capacitance of the at least one capacitor to adjust an inductance of the at least one inductor.

Although some of the aspects of the subject matter disclosed herein have been stated hereinabove, and which are achieved in whole or in part by the presently disclosed subject matter, other aspects will become evident as the description proceeds when taken in connection with the accompanying drawings as best described hereinbelow.

BRIEF DESCRIPTION OF THE DRAWINGS

The features and advantages of the present subject matter will be more readily understood from the following detailed description, which should be read in conjunction with the accompanying drawings that are given merely by way of explanatory and non-limiting example, and in which:

FIGS. 3A to 3D illustrate various operations of an inductance tuning system according various embodiments of the presently disclosed subject matter;

FIGS. 4A to 4C are different signal feed configurations of an inductance tuning system according various embodiments of the presently disclosed subject matter;

FIGS. 6A to 6C illustrate various configurations of coupling an electric field into an inductance tuning system according various embodiments of the presently disclosed subject matter;

DETAILED DESCRIPTION

The present subject matter provides systems, devices, and methods that use inductance tuning systems comprising of a plurality of tunable capacitors that can tune inductances and impedances over a wide frequency range. Such an inductance tuning system can be easily implemented on a PCB/PWB substrate, which can bring down the size of a tunable antenna, make it more robust, more easily to be integrated with other circuit components, and at the same time maintain a constant characteristic impedance over a wide range of frequencies.

Figure 1:
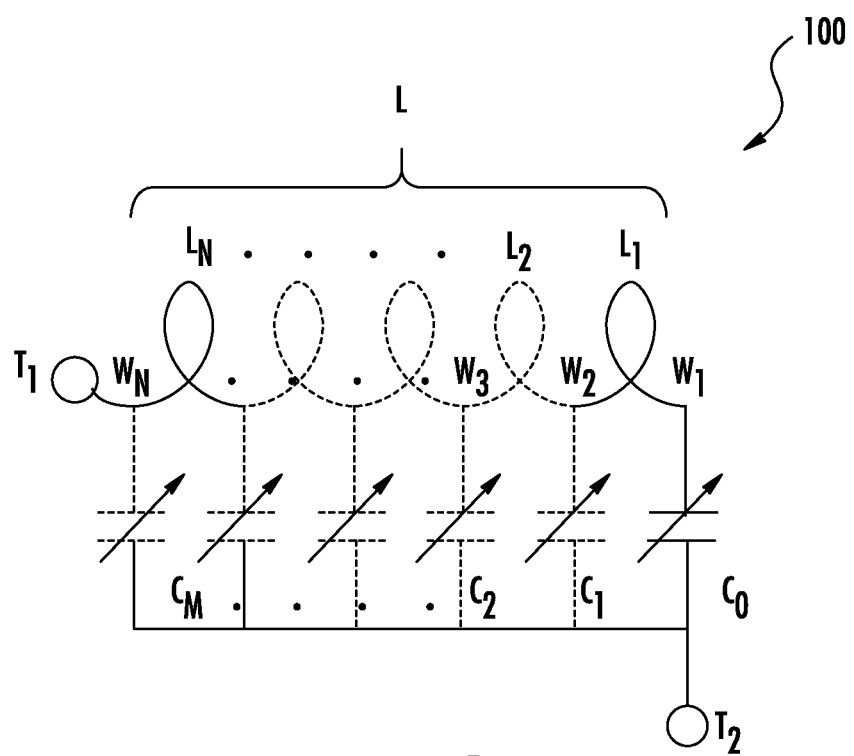
FIG. 1 is a schematic representation of an inductance tuning system according various embodiments of the presently disclosed subject matter.

FIG. 1 is a schematic representation of an inductance tuning system according to an embodiment of the presently disclosed subject matter. As illustrated in FIG. 1, an inductance tuning system, generally designated 100, can include an inductor L comprising a number N of windings $L_1$ through $L_N$ distributed throughout the inductor L, where N is a selectable integer value. In some embodiments, spacing between each of windings $L_1$ through $L_N$ is substantially less than their diameters, and thus windings $L_1$ through $L_N$ can be substantially magnetically coupled to each other. One or more variable capacitors (e.g., capacitors $C_0$-$C_M$) can be connected to a plurality of taps $W_1$ through $W_N$ of inductor L, where a tap can be a node connecting two of windings $L_1$ through $L_N$ of inductor L. For the purpose of illustrating the subject matter disclosed herein, one variable capacitor is connected to a first connection point $T_1$, and variable capacitors $C_0$-$C_M$ can all be connected to a second connection point $T_2$. For example, variable capacitor $C_0$ can be connected to a first tap $W_1$, variable capacitor $C_1$ can be connected to a second tap $W_2$, and variable capacitor $C_M$ can be connected to an nth tap $W_N$, etc. However, it is plausible that a particular tap/winding would have no capacitor attached to it. Furthermore, first and second connection points $T_1$ and $T_2$ as illustrated in FIG. 1 can be connected to other reactive elements (e.g., series or shunt capacitors and/or series or shunt inductors), and as such, inductance tuning system 100 does not have to be self-resonant at a frequency of operation.

In some embodiments, capacitors $C_0$-$C_M$ can be semiconductor devices (e.g., CMOS, PHEMT, Silicon-On-Insulator (SOI), Micro-electro-mechanical systems (MEMS), tunable ceramics, BST) controlled by varying electric field or current. Variable capacitances can be achieved using electromechanical-actuation (e.g., MEMS), Electric field actuation (e.g., pin diodes, tunable dielectrics), or electrical semiconductor switches connected to an array of capacitances. The electrical semiconductor switches may be based on voltage field switching (e.g., PHEMT, CMOS) or current switching (e.g., bipolar transistors like GaAs HBT). Furthermore, in some embodiments, capacitors $C_0$-$C_M$ can be programmable using either one or more serial buses (e.g., SPI, RFFE, I2C) or programmable registers that operate with semiconductor devices (e.g., transistors, gates, ADCs) to produce variable capacitance values. In some embodiments, a variable capacitance value can be programmable to an integer number of discrete capacitance settings according to a binary weighting scheme or a linearly weighting scheme.

Figure 2:
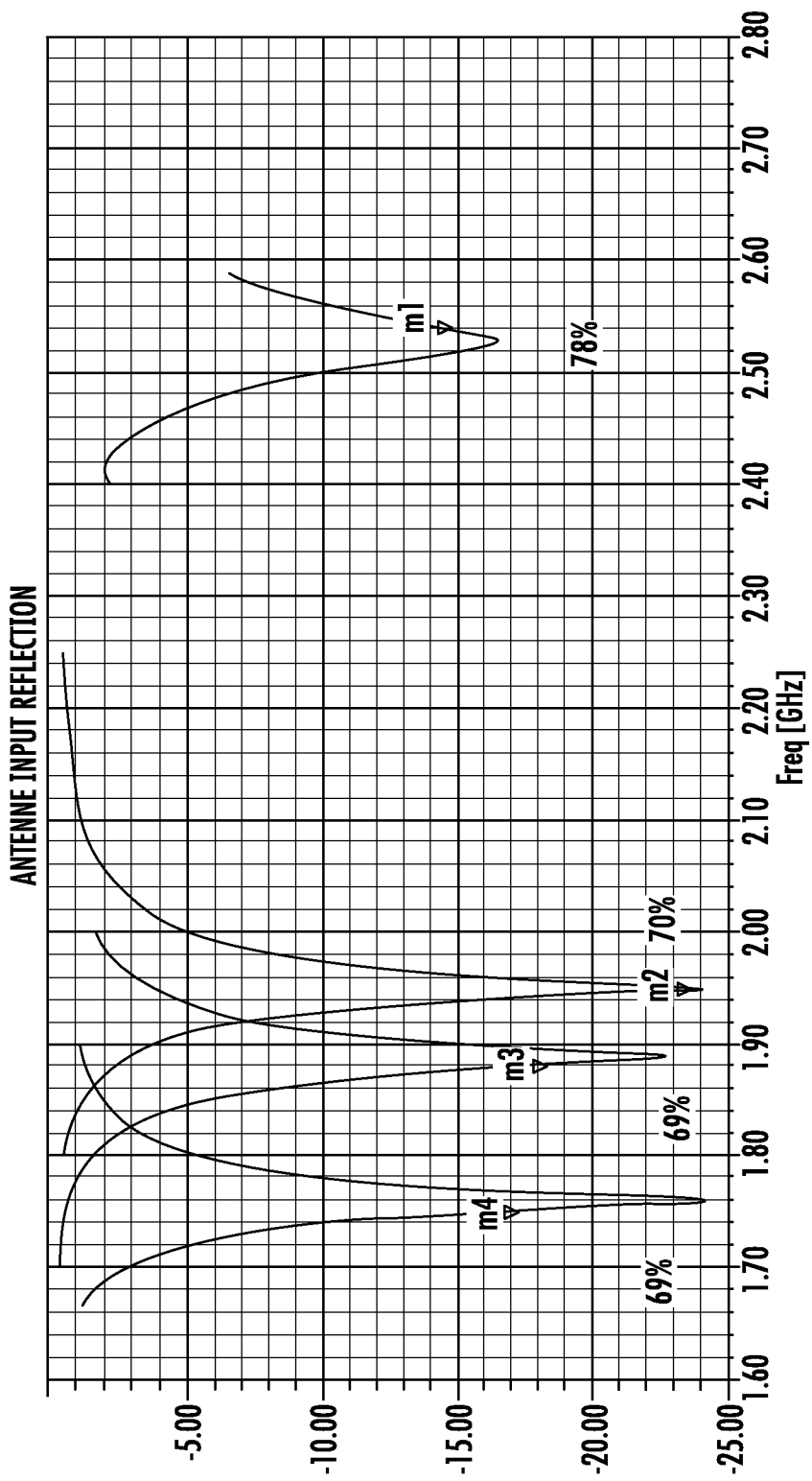
FIG. 2 illustrates a frequency response graph of an inductance tuning system according various embodiments of the presently disclosed subject matter.

In some embodiments, the impedance value of inductance tuning system 100 can be most dominantly influenced by one of variable capacitors $C_0$ through $C_M$ with the largest capacitance value. For example, if the capacitance values of capacitor $C_1$ to $C_M$ are controlled to have comparatively low capacitance values, the impedance value of inductance tuning system 100 can be effectively controlled by the inductance value in series between taps $W_N$ through $W_1$ and the capacitance value of capacitor $C_0$. Similarly, if capacitors $C_0$ and $C_2$-$C_M$ are configured to have low capacitance values, the impedance value of inductance tuning system 100 can be determined by the inductance value in series from taps $W_M$ to $W_2$ and the capacitance value of capacitor $C_1$. As such, when a particular capacitor $C_x$ among capacitors $C_0$-$C_M$ is configured to have a capacitance value that is comparatively larger compared to the capacitance values of the rest of capacitors $C_0$-$C_M$, the impedance value of inductance tuning system 100 can be correspondingly controlled by the inductance value in series from first connection point $T_1$ to that tap to which capacitor $C_x$ is connected and the capacitance value of capacitor $C_x$. This configuration enables inductance tuning system 100 to achieve a wider tuning range compared to conventional systems, where the tuning range is limited by a tuning capacitance ratio (e.g., $C_{max}/C_{min}$). As illustrated in FIG. 2, inductance tuning system 100 can be configured to provide impedance matching over a large frequency range (e.g., 1.6 GHz to 2.8 GHz) with similar efficiencies to conventional systems.

In some embodiments, the configuration as illustrated in FIG. 1 can also provide a system designer with precise and convenient control over the characteristic impedance of the system over a wide frequency range (e.g., to keep the characteristic impedance constant over a frequency range), thereby improving the performance of a cellular communication system. For example, for multi-band applications, the capacitance value and its position along inductor L (e.g., a selected one of capacitors $C_0$-$C_M$ connected to a corresponding tap on inductor L as illustrated in FIG. 1) can be selected such that the impedance of the tuning capacitance can be kept constant.

In some embodiments, the general concept illustrated by inductance tuning system 100 can be utilized to further improve a resonator's tuning range by reduce or eliminate parasitics in the capacitive tuning elements. For example, FIG. 3A illustrates a schematic representation of an inductance tuning system, generally designated 300, in accordance to an embodiment of the presently disclosed subject matter. Inductance tuning system 300 can include an inductor 302 comprising of a plurality of windings $L_1$-$L_4$ distributed through the length of inductor 302. Variable capacitors $C_0$-$C_3$ can be connected to taps $W_1$-$W_4$ of inductor 302 and can be utilized to adjust the impedance value of inductance tuning system 300. In some embodiments, parasitics in the capacitive tuning elements can be minimized by tuning the lowest frequencies (e.g., $f_{min}$) using variable capacitor $C_0$. For example, for low frequency bands, $C_0$ can be adjusted to have a high capacitance value compared to capacitors $C_1$-$C_3$, and as such, the resonance frequency of inductance tuning system 300 can be determined by the maximum total inductance of inductor 302 (e.g., summed inductance across all of windings $L_1$+$L_2$+$L_3$+$L_4$) and the capacitance value of capacitor $C_0$, as depicted in FIG. 3B. For high frequency bands, inductance tuning system 300 can be configured to operate in a multi-resonant mode.

As depicted in FIGS. 3C and 3D, the capacitance value of variable capacitor $C_3$ can be selectively adjusted to resonate with inductance value of fourth winding $L_4$, while variable capacitors $C_0$-$C_2$ can be selectively tuned to achieve a high impedance value (e.g., parallel resonance close to the operation frequency) with inductance values of first and second windings $L_1$-$L_2$. As such, because $C_3$ is the primary variable capacitor used for tuning the resonance frequency, capacitance values of capacitors $C_0$-$C_2$ can be kept relatively small and thereby reducing the parasitics associated with capacitors $C_0$-$C_2$ as well. Furthermore, because a minimum capacitance $C_{min}$ is at least partially determined by the parasitic capacitances, the minimum capacitance $C_{min}$ can be reduced by the configuration described above. Accordingly, because the frequency tuning range of inductance tuning system 300 depends at least partially on the ratio between the minimum capacitance $C_{min}$ and a maximum capacitance $C_{max}$ (e.g., $C_{max}/C_{min}$), system 300 can operate in a wider frequency range compared to a conventional system.

In some embodiments, inductance tuning system 100 as described in FIG. 1 can be implemented using multiple inductors (e.g., SMD inductors) or a single multi-turn inductor with tapped outputs (e.g., helical type). FIGS. 4A-4C illustrate a multi-turn inductor with one or more tapped outputs according to various embodiments of the presently disclosed subject matter. In some embodiments, a first configuration of a multi-turn inductance tuning system, generally designated 400, can be a three terminal system, such as is illustrated in FIG. 4A. In addition to first and second connection points $T_1$ and $T_2$, multi-turn inductance tuning system 400 can also include a third connection point $T_3$ tied to capacitor $C_0$. Furthermore, in some embodiments as illustrated in FIG. 4B, a second configuration for a multi-turn inductance tuning system, generally designated 402, can be configured such that second and third connection points $T_2$ and $T_3$ are coupled together, effectively making system 402 a two terminal system. Further still, in some embodiments as illustrated in FIG. 4C, a third configuration for a multi-turn inductance tuning system, generally designated 404, can have third connection point $T_3$ being coupled to second connection point $T_2$ and also tied to a signal ground, effectively making multi-turn inductance tuning system 404 a one terminal system.

Figure 5:
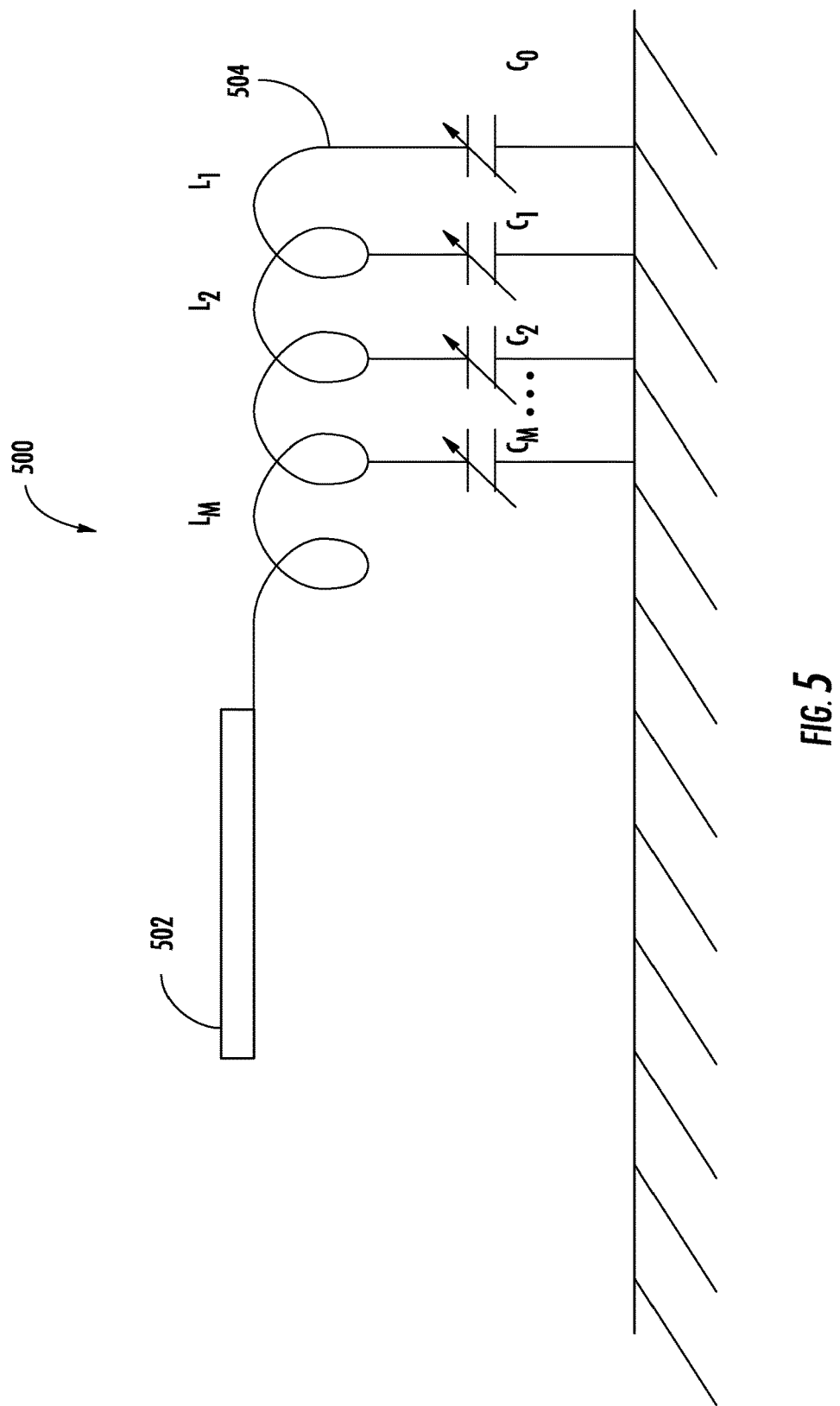
FIG. 5 illustrates an antenna structure utilizing an inductance tuning system according various embodiments of the presently disclosed subject matter.

In some embodiments, the general principle previously disclosed in FIG. 1 can be applied to an antenna element to construct a tunable antenna structure. FIG. 5 illustrates an antenna structure, generally designated 500, according to embodiments of the presently disclosed subject matter. Antenna structure 500 can include a multi-turn inductor 504 comprising of a plurality of windings $L_1$ through $L_M$. Variable capacitors $C_0$-$C_M$ can be connected to taps of inductor 504 and can be adjusted accordingly to produce desired impedance values. In some embodiments, capacitors $C_0$-$C_M$ and inductor 504 can effectively function as a LC ladder network, and an antenna element (i.e., antenna coupling plate 502) can be tied to inductor 504 for coupling electric fields and/or currents, where the antenna element can be a conductive material designed to radiate electric or magnetic field, sometimes directly to the far-field. In some embodiments, the antenna element can be an antenna coupling element that couples its electric or magnetic field to another conductive body and thereby induces currents or electric fields that can be further coupled to the far field. In some embodiments, an electric field can be capacitively coupled to antenna structure 500, and the LC ladder can be tuned to resonate at multiple frequencies for a resonator. Furthermore, the LC ladder can tune a resonance frequency such that the resonator can be effectively modeled as a series L, shunt C near the resonance frequency. As such, the LC ladder network together with the capacitance of antenna coupling plate 502 can effectively form a combined equivalent Pi network, where the combined equivalent Pi network can dominate the frequency of resonance. As previously disclosed (e.g., FIGS. 3A-3D), the LC ladder network can advantageously provide frequency tuning over a wide frequency range despite the fact that variable capacitors $C_0$-$C_M$ can include some fixed non-variable capacitances (e.g., parasitic capacitances). In addition, such LC ladder network also enables a system designer to control the characteristic impedances of the resonator (e.g., to keep the characteristic impedance constant over a wide frequency range).

In some embodiments, the antenna element can be a conductive plate (e.g., patch) or a conductive material with a cylindrical shape (e.g., wire). In some embodiments, the antenna element can be a conductive geometrical shape fabricated by stamping, casting, etching or laser direct structuring (LDS). In some embodiments, the antenna element can be replaced by an electric connector, where the electric connector can be connected to another antenna element.

In this regard, for example, FIGS. 6A to 6C illustrate various configurations where an electric field can be coupled into an antenna structure (e.g., antenna structure 500) according to embodiments of the presently disclosed subject matter. As illustrated in FIG. 6A, an electric field can be capacitively coupled to antenna coupling plate 502 from a feed terminal $P_1$ and through a capacitor 602. Alternatively or in addition, in some embodiments as depicted in FIG. 6B, an electric field can be coupled into antenna coupling plate 502 from a feed terminal $T_1$ through another coupling plate 604. In yet a further alternative, a feed terminal $T_1$ can be capacitively coupled into antenna coupling plate 502 via a fixed or variable capacitor. For example, one of the variable capacitors in the LC ladder network can be disconnected from ground and be tied to feed terminal $T_1$ instead. In yet another embodiment, magnetic fields can also be coupled into antenna structure 500 via antenna coupling plate 502.

Figure 9:
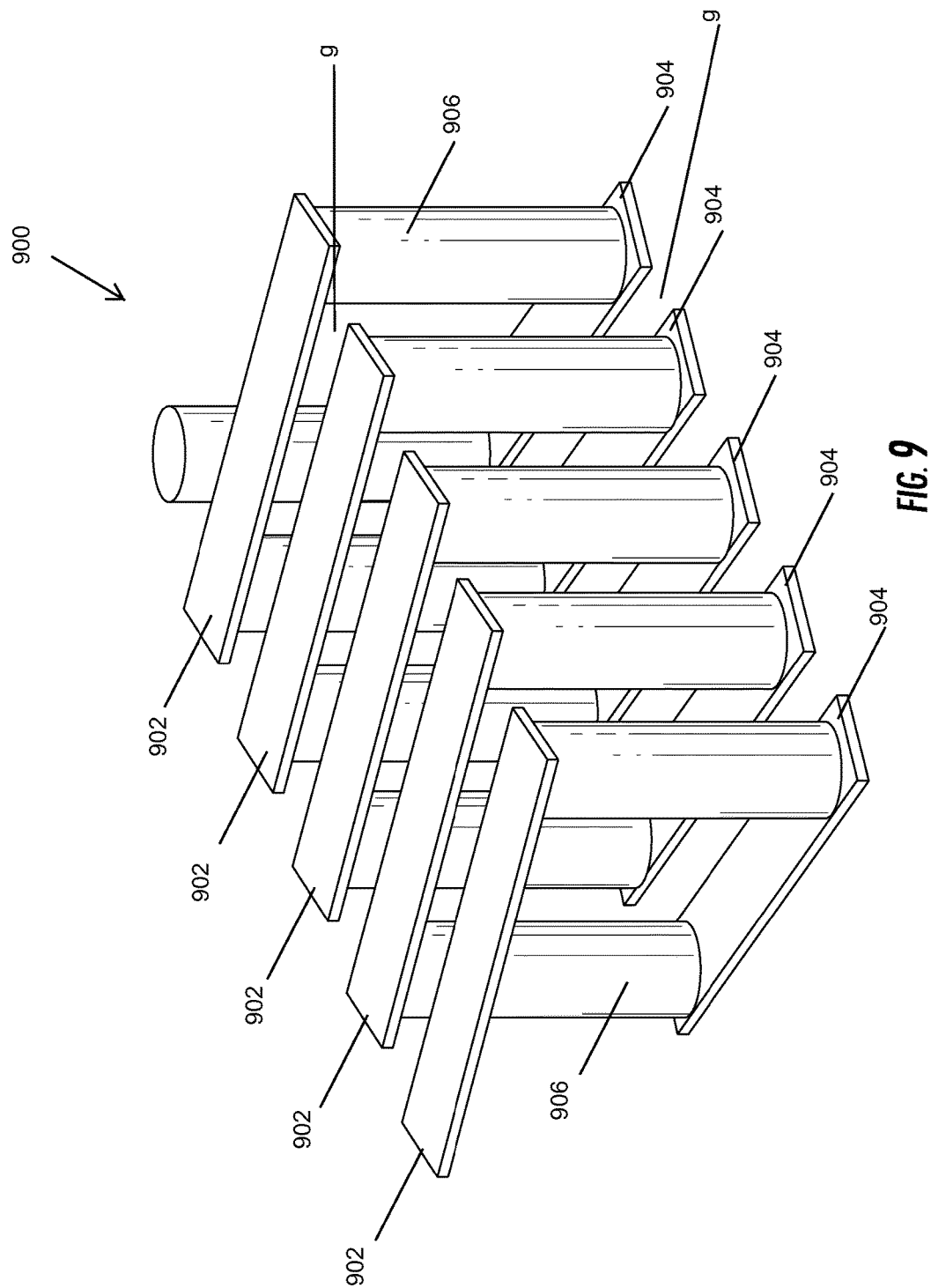
FIG. 9 illustrates an exemplary configuration of a vertical inductor according various embodiments of the presently disclosed subject matter.

To achieve an inductance tuning system having any of the above arrangements, the system can be constructed in any of a variety of configurations. In some embodiments, for example, a vertical inductor fabricated using planar technology can be utilized for inductance tuning purposes. FIG. 9 illustrates an exemplary configuration of a vertical inductor, generally designated 900, in accordance with embodiments of the subject matter disclosed herein. Inductor 900 can include a plurality of layer 1 structures 902 and a plurality of layer 2 structures 904 that effectively function as windings of a multi-turn inductor. Specifically, for example, layer 1 structures 902 and Layer 2 structures 904 can be fixed on opposing sides of a substrate (not shown) and connected by a plurality of vias 906 as illustrated in FIG. 9, where the thickness or length of the vias can be substantially the same as the thickness of the substrate. In some embodiments, gaps g between each of layer 1 structures 902 and layer 2 structures 904 can be narrow enough such that magnetic fields generated by layer 1 structures 902 and layer 2 structures 904 are coupled together. In some embodiments, electric fields generated by inductor 900 can be a horizontal field, and the magnetic field can be aligned with the center of the turns approximately at the middle of the inductor to form a rough dipole. Furthermore, connection terminals can be tied to either or both of layer 1 structures 902 and/or layer 2 structures 904 as a feed for inductor 900.

Figure 10:
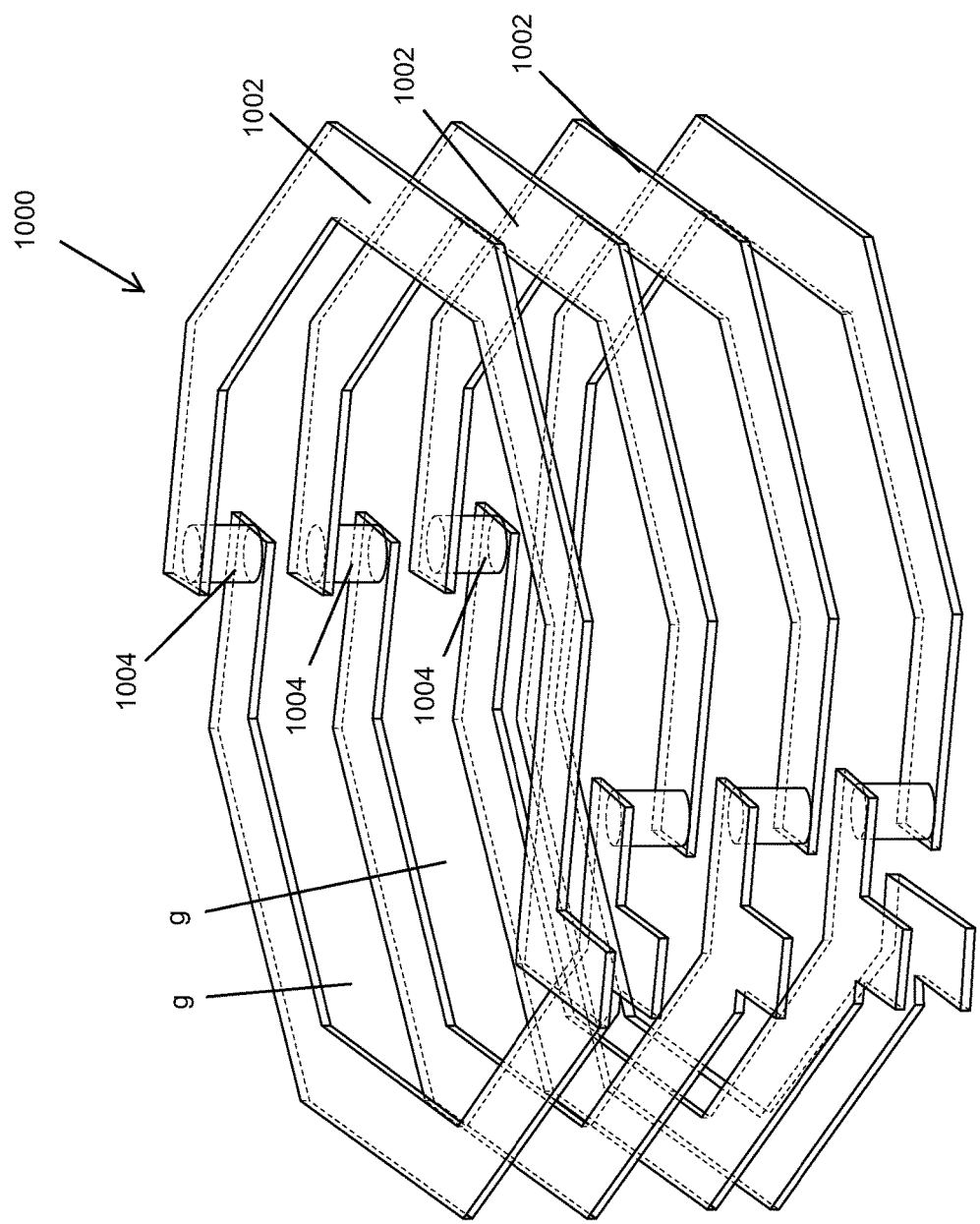
FIG. 10 illustrates a multi-layer planar inductor according various embodiments of the presently disclosed subject matter.

In an alternative physical configuration, a multi-layer inductor can be utilized with the inductance tuning system. As illustrated in FIG. 10, for example, a multi-layer planar inductor 1000 can be fabricated by connecting a plurality of substantially planar windings 1002 through a plurality of vias 1004. Each of substantially planar windings 1002 can be fixed to a non-conductive laminate surface (e.g., PCB) and function as a winding to a multi-turn inductor. Furthermore, each of substantially planar windings 1002 can be separated by a nonconductive laminate layer with thickness g such that magnetic fields generated by each of substantially planar windings 1002 can be coupled together.

Figure 7A:
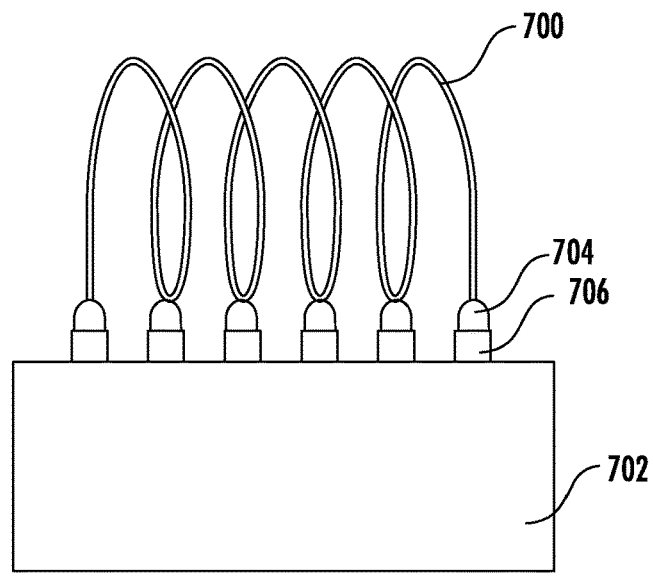
FIGS. 7A to 7C illustrate various implementations of an inductance tuning system according various embodiments of the presently disclosed subject matter.
Figure 7B:
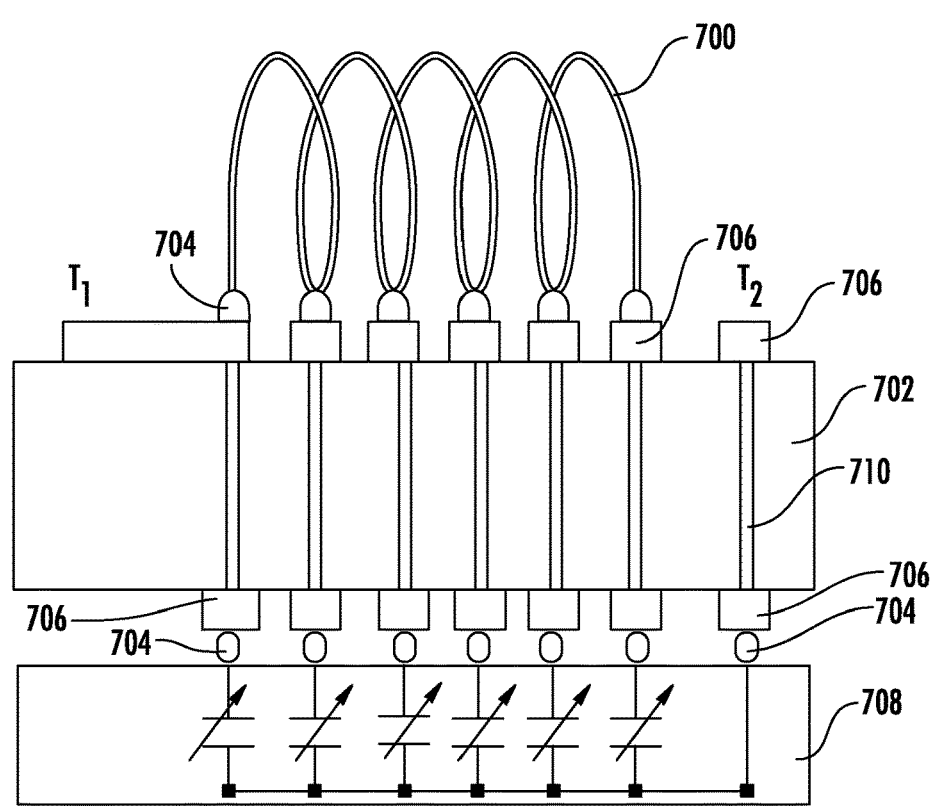

In some embodiments, the general concept disclosed in FIG. 1 can be implemented in a confined space. FIGS. 7A and 7B illustrate various implementations of an inductance tuning system according to embodiments of the presently disclosed subject matter. As depicted in FIG. 7A, for example, an inductor 700 comprising of a plurality of windings can be fixed to a nonconductive laminate substrate 702 (e.g., PCB or PWB), where nonconductive laminate surface 702 can be further connected to an array of capacitors. For example, inductor 700 can be constructed from a single piece of wounded wire of conductive material (e.g., copper, aluminum, gold, silver, etc.) where one or more taps of inductor 700 can be connected with conductive circuit laminate material 706 using solder-like materials 704 or wire-bonding. In some embodiments, a capacitor array 708 can be fixed to an opposite side of nonconductive laminate substrate 702 and be connected to inductor 700 through a plurality of via connections 710. For example, capacitor array 708 can include a plurality of variable capacitors, and each variable capacitor can be connected with conductive circuit laminate material 706 using solder-like materials 704 (e.g., solder balls or solder paste) or wire-bonding techniques. A plurality of vias 710 constructed through nonconductive laminate substrate 702 can connect taps on inductor 700 with individual variable capacitors by connecting the conductive circuit laminate materials 706. Furthermore, first and second connection points $T_1$ and $T_2$ can be constructed using conductive circuit laminate material 706 to provide input and/or feed terminals. This configuration advantageously allows an implementation of an inductance tuning system within a confined space, which can result in improved resonator quality factor (e.g., low inter inductor contact losses, etc.).

Figure 7C:
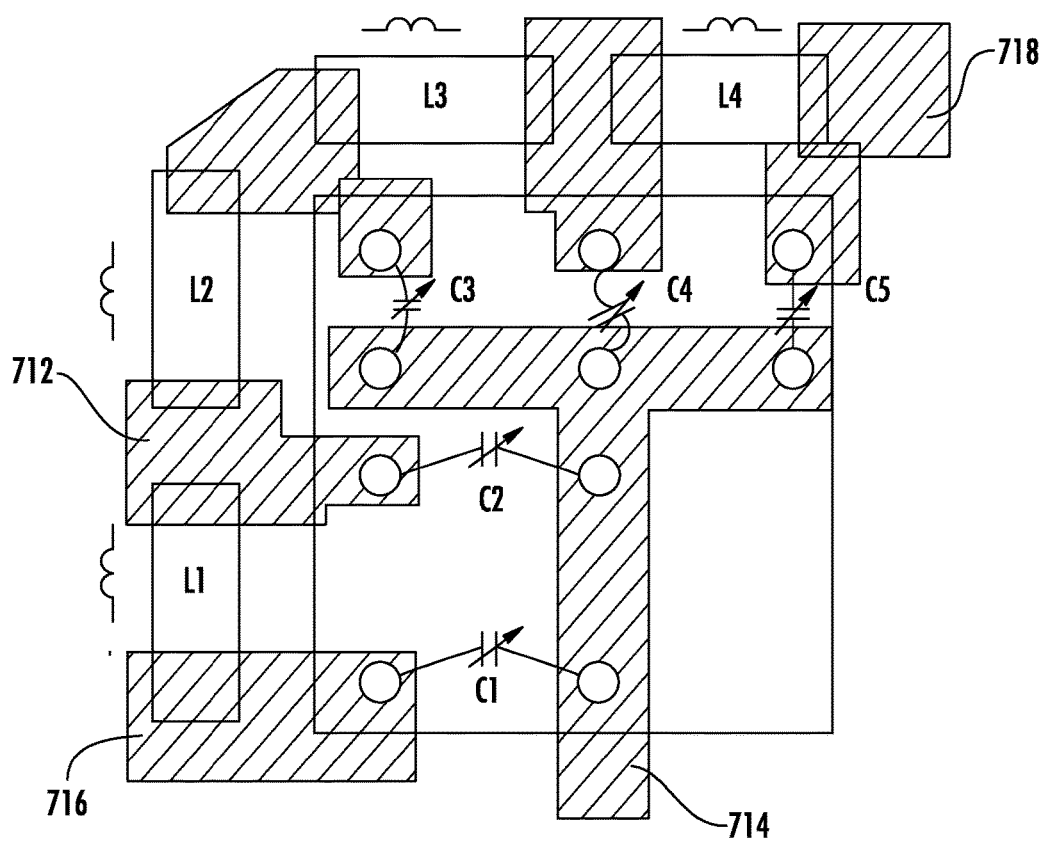

In some embodiments, SMD or SMT inductors and capacitors can be utilized to implement a LC ladder network for inductance tuning purposes. FIG. 7C illustrates an exemplary configuration of a LC ladder network comprising of SMD components in accordance to various embodiments of the presently disclosed subject matter. As illustrated in FIG. 7C, SMD inductors $L_1$-$L_4$ can be electrically coupled to SMD capacitors $C_1$-$C_5$ through conduction traces 712 by soldering, and SMD inductors $L_1$-$L_4$ can be placed closely to each other such that their generated magnetic fields can be coupled together. In some embodiments, each of the inductors $L_1$-$L_4$ can function as windings of a multi-turn inductor, and capacitors $C_1$-$C_5$ can be connected to nodes between two inductors for tuning impedances. Furthermore, connection terminals 714, 716 and 718 can each be tied to a capacitor for providing control signals and/or be coupled to another antenna element.

Figure 8A:
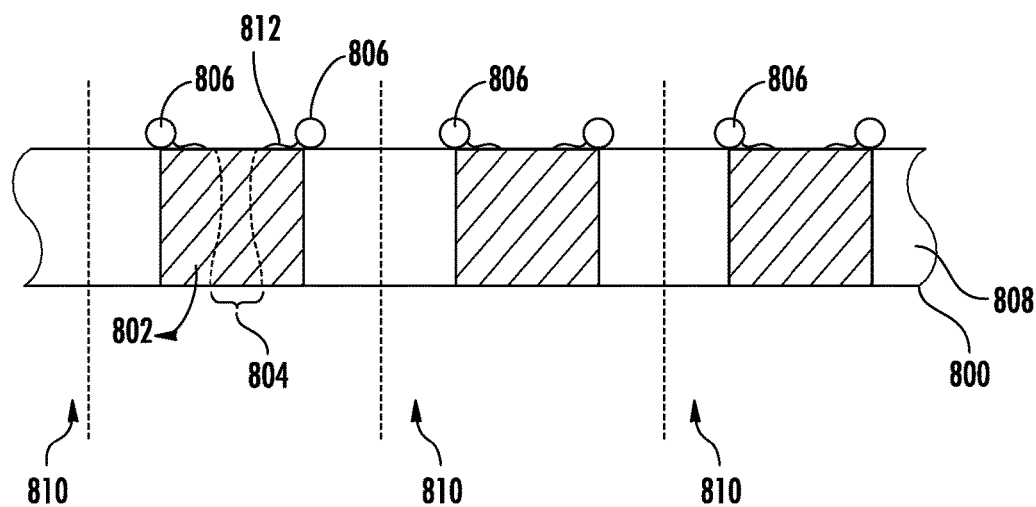
FIGS. 8A and 8B are cross section views of an inductance tuning system packaged using embedded wafer level ball grid array (eWLB) technology illustrates a side view according various embodiments of the presently disclosed subject matter.

In some embodiments, the general concept disclosed in FIG. 1 can be implemented using embedded wafer level ball grid array (eWLB) packaging technology. FIG. 8A illustrates a cross section view of an artificial or handling wafer being prepared for the eWLB process according to embodiments of the presently disclosed subject matter. As illustrated in FIG. 8A, a plurality of device dies 802 can be firstly placed or populated on an artificial wafer 800 where device die 802 can include electrical circuitries and variable capacitor arrays. The space between device dies 802 can then be filled with a mold compound 808, where mold compound 808 can include silica fillers to make its mechanical properties similar to silicon. Interconnects such as solder balls 806 and RDLs 812 can be placed for providing electrical connections to device dies 802. In some embodiments, connection vias 804 can be etched through device dies 802 for providing additional electrical connections. Mold compound 808 can be diced along dice lines 810 and individual device dies 802 can be obtained for further assembly with other device components.

Figure 8B:
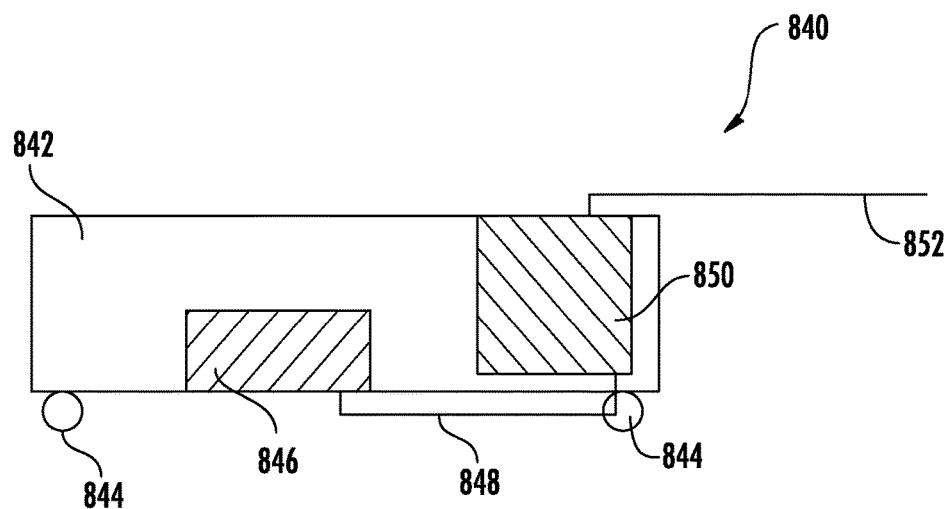

FIG. 8B illustrates a cross section view of an inductance tuning structure, generally designated 840, being packaged using eWLB according to embodiments of the subject matter disclosed herein. Structure 840 can include a device die 846 embedded in mold compound 842, where device 846 can include an array of variable capacitors and other electrical circuitries. Interconnects such as solder balls 844 and RDLs 848 can provide electrical connections between die 846 and other device components such as an inductor 850. Inductor 850 can further be connected to an antenna element 852 for providing impedance tuning to an antenna. This configuration can advantageously have a fan out area where additional input/output terminals can be integrated into a single device structure (e.g. structure 840), thereby increases I/O density, and improves process easiness and integration flexibilities.

Figure 11:
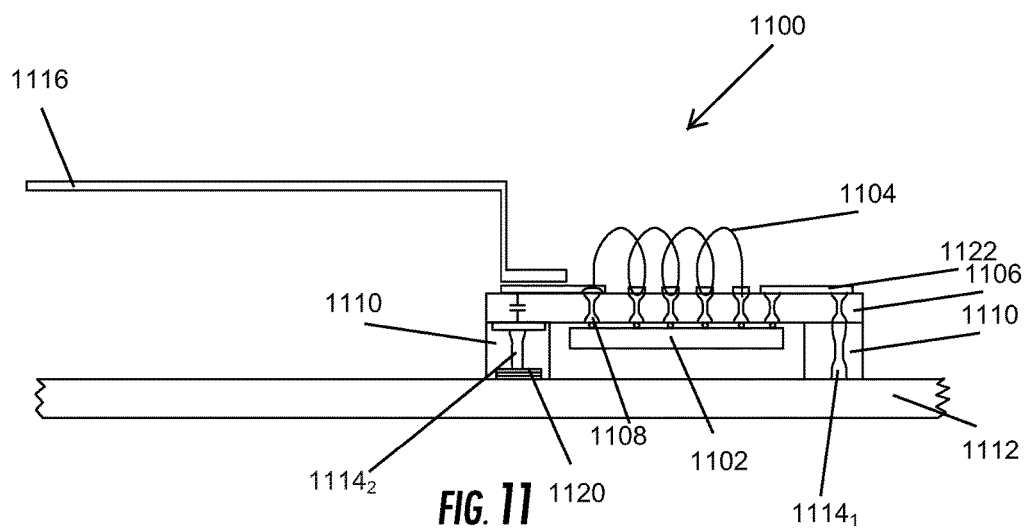
FIG. 11 illustrates an inductance tuning system mounted on a printed circuit board (PCB) according various embodiments of the presently disclosed subject matter.

In some embodiments, an inductance tuning system can be implemented on a printed circuit board (PCB) or printed wire board (PWB) using multi-turn or multi-tap inductors. FIG. 11 illustrates an inductance tuning system, generally designated 1100, mounted on a PCB or PWB surface according to embodiments of the presently disclosed subject matter. As illustrated in FIG. 11, a multi-turn inductor 1104 and a capacitor array 1102 can be fixed to opposite sides of a nonconductive laminate material layer 1106, where the capacitor array can include a plurality of variable capacitors. In some embodiments, individual capacitors in capacitor array 1102 can be connected to individual windings of inductor 1104 through a plurality of vias 1108 etched through layer 1106, where windings of inductor 1104 are connected to vias 1108 using conductive material (e.g., solder balls). Furthermore, capacitor array 1102 can be flip-chipped onto the backside of nonconductive laminate material layer 1106 and encapsulated in a cavity by one or more supports 1110, where supports 1110 can be mounted on a PCB/PWB or module laminate surface 1112. Vias 1114$_1$, 1114$_2$ can be etched through supports 1110 for providing signal feeds and/or electrical connections. For example, an antenna element 1116 such as a shaped sheet metal can be electrical coupled to a first terminal of inductor 1104, where the first terminal can be capacitively coupled to an antenna feed point 1120 through via 1114$_2$. Alternatively, antenna feeds can be tied directly to antenna element 1116 or be connected to one or more capacitors in capacitor array 1102. In some embodiments, inductor 1104 can also be a sheet metal inductor and a second terminal 1122 can be tied to inductor 1104, where second terminal 1122 can be tied to ground, a control signal or supply voltages. It should be noted that even though multi-turn inductors fabricated using single wires are used for illustrating the general concept here, other kinds of inductors (e.g., SMD/SMT inductors) can be conveniently utilized. For example, SMD inductors and capacitors can be surface mounted to layer 1106 and encapsulated in the cavity as described above.

Figure 12:
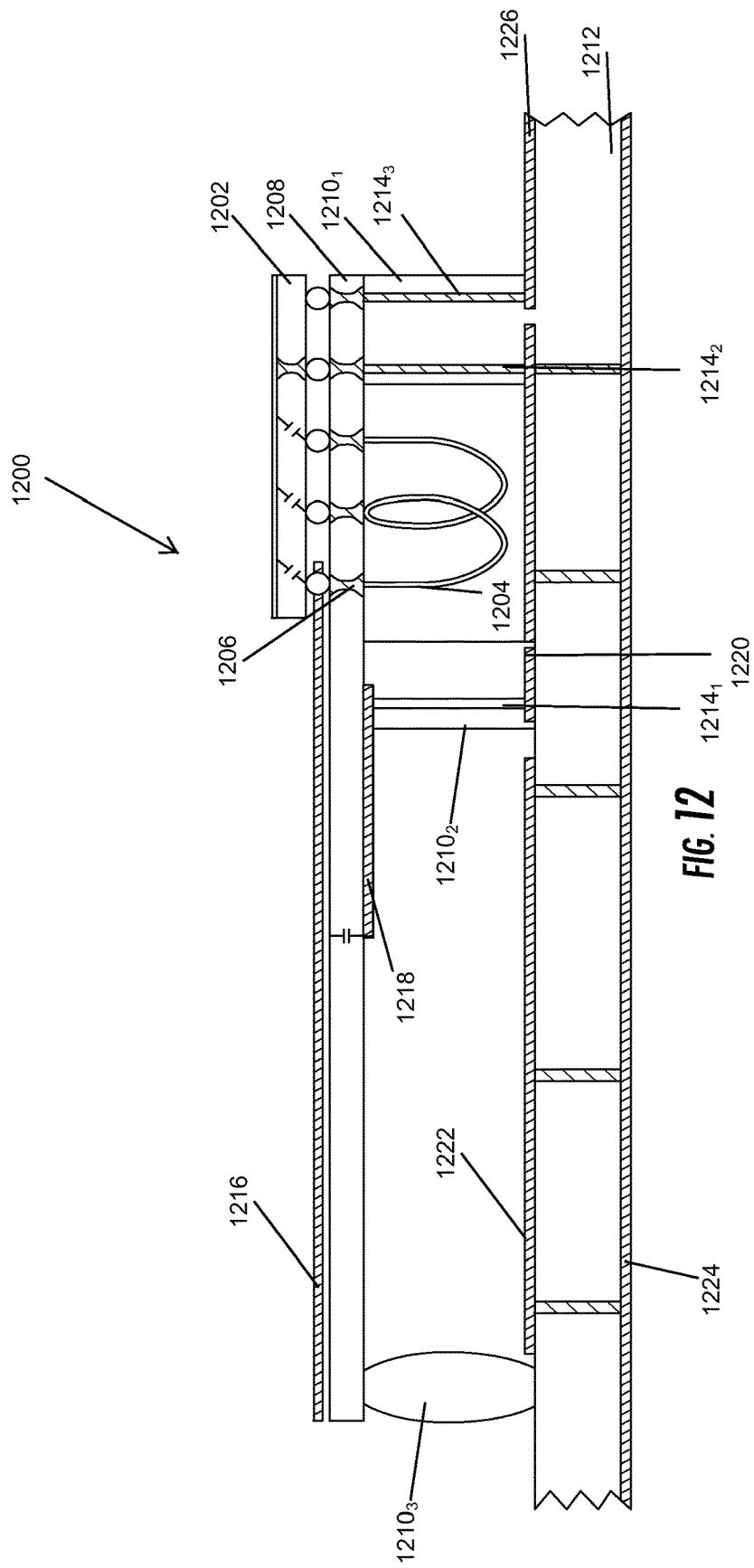
FIG. 12 illustrates another inductance tuning system mounted on a PCB according various embodiments of the presently disclosed subject matter.

FIG. 12 illustrates another configuration of an inductance tuning system, generally designated 1200, implemented on a PCB according to embodiments of the presently disclosed subject matter. As illustrated in FIG. 12, a capacitor array 1202 and a multi-turn inductor 1204 can be attached to opposite sides of a nonconductive laminate layer 1208, where capacitor array 1202 can include a plurality of variable capacitors connected to windings of inductor 1204 through a plurality of vias 1206. Configuration 1200 can further include supports 1210₁, 1210₂, and 1210₃ positioned between nonconductive laminate layer 1208 and PCB substrate 1212, where vias 1214₁, 1214₂ and 1214₃ can be etched though supports 1210₁ and 1210₂ for providing electrical signals and/or bias voltages. An antenna element 1216 such as an antenna coupling plate can be tied to one or more variable capacitors of capacitor array 1202. A feed coupling plate 1218 can be the opposing side of laminate layer 1208 spaced apart from antenna element 1216. Feed coupling plate 1218 be connected to a signal feed point 1220 through via 1210₂ embedded in support 1210₂. Signal feeds received by feed coupling plate 1218 can be capacitively coupled to antenna element 1216. Alternatively, signal can be fed directly to antenna element 1216 (e.g., an inverted F antenna) or coupled into a feed terminal of inductor 1214 or a capacitor of capacitor array 1202. Configuration 1200 can further include a first ground plate 1222 tied to a second ground plate 1224 through a plurality of vias, where second ground plate 1224 can be fixed to an opposite side of PCB substrate 1212 away from inductor 1214 and capacitor array 1212. Second ground plate 1224 can provide grounding to capacitor array 1202 through via 1214₂ embedded in support 1210₁. Configuration 1200 can further include a connection terminal 1226 where control signals can be coupled into capacitor array 1202 from terminal 1226 through via 1214₃ embedded in support 1210₁. In addition, fixed supports 1210₁ and 1210₂ can effectively function as shielding walls, encapsulating inductor 1214 from unwanted physical contacts, thereby improve overall device reliability.

Figure 13A:
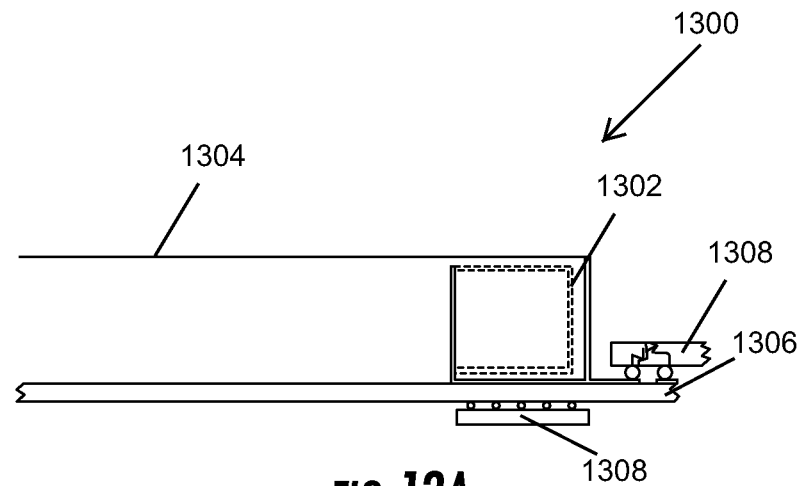
FIGS. 13A and 13B illustrate a configuration in which an inductance tuning system can be integrated into a PCB substrate according various embodiments of the presently disclosed subject matter.
Figure 13B:
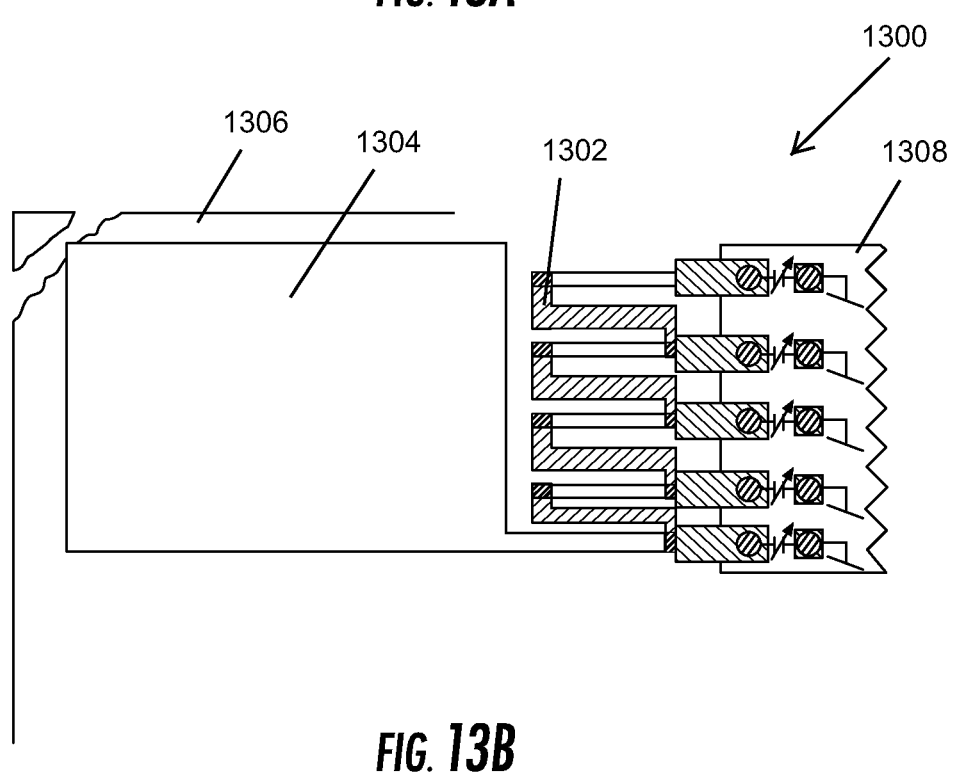

FIGS. 13A and 13B illustrate yet another configuration, generally designated 1300, where an inductance tuning system can be integrated onto a PCB according to embodiments of the presently disclosed subject matter. In some embodiments, an inductor and an antenna element such as an antenna plate can be constructed out of a single piece of shaped sheet metal. As illustrated in FIG. 13A, configuration 1300 can include an inductor 1302 and antenna coupling plate 1304 fabricated from a single piece of shaped sheet metal and fixed to a surface (e.g., top surface) of a PCB substrate 1306. Inductor 1302 can be electrically coupled to a capacitor array 1308, where capacitor array 1308 can be either fixed to the same top surface of substrate 1306 or on an opposite surface (e.g., bottom surface). For example, capacitor array 1308 can be flip chipped onto the bottom surface of substrate 1306 using inter-connect materials (e.g., solder balls), and a plurality of vias can be etched through substrate 1306 connecting capacitor array 1306 with inductor 1302. Alternatively, capacitor array 1308 can be coupled to the same top surface as inductor 1302 (e.g., using solder-like material) and can be connected to inductor 1302 through conductive traces.

FIG. 13B illustrates a top view of configuration 1300 according to embodiments of the presently disclosed subject matter. As illustrated in FIG. 13B, an antenna element 1304 and an inductor 1302 can be both fixed on a top surface of PCB substrate 1306. Antenna element 1304 can be an antenna coupling plate electrically coupled to inductor 1302, and inductor 1302 can be a multi-turn inductor made out of bent sheet metal. Capacitor array 1308 can include a plurality of variable capacitors, where the variable capacitors can be attached to windings of inductor 1302 through a plurality of conductive traces. Alternatively, capacitor array 1308 can be attached to the backside (not shown) of substrate 1306 and be connected to inductor 1302 through a plurality of vias.

Figure 14A:
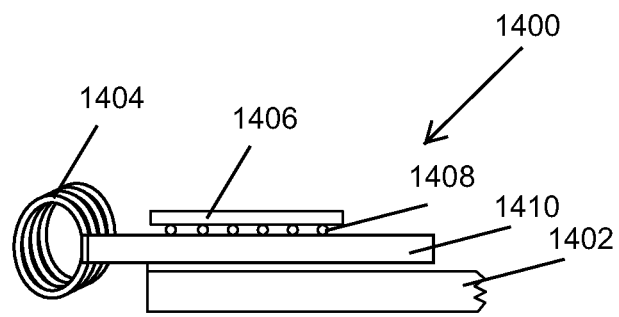
FIGS. 14A and 14B illustrate an implementation where an inductor is mounted to an edge of a circuit laminate layer according various embodiments of the presently disclosed subject matter.
Figure 14B:
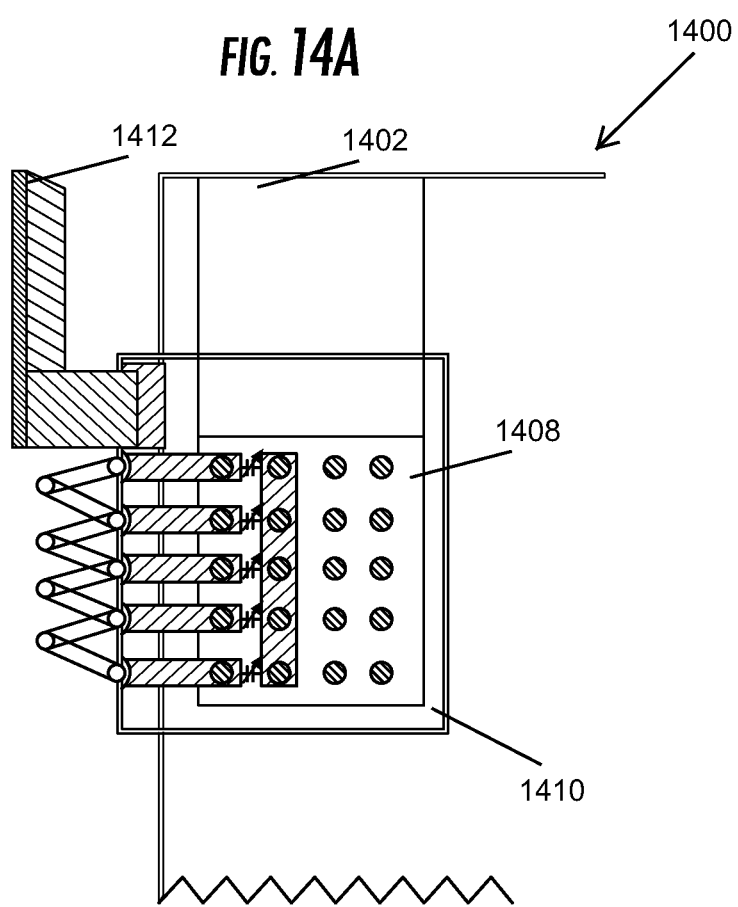

In some embodiments, an inductance tuning system can have inductors and/or capacitor arrays mounted on the edges of a circuit laminate layer. FIGS. 14A and 14B are illustration of an implementation, generally designated 1400, where an inductor is mounted to an edge of a circuit laminate layer according to embodiments of presently disclosed subject matter. As illustrated in FIG. 14A, an inductor 1404 can be mounted on an edge of a circuit laminate material 1410, and a capacitor array 1406 can be fixed to a top surface of said laminate material 1410 using interconnect materials (e.g., solder balls). Capacitor array 1406 can include a plurality of variable capacitors and be connected to inductor 1404 through a plurality of conductive traces (not shown). Circuit laminate material 1410 can be mounted on a PCB substrate 1402 where additional circuit components may also be mounted.

FIG. 14B illustrates a top view of implementation 1400 according to embodiments of presently disclosed subject matter. As illustrated in FIG. 14B, inductor 1404 can be mounted on the edge of circuit laminate material 1410 and connected to capacitor array 1408 through a plurality of conductive traces, where capacitor array 1408 can include a signal or grounding pad and where control signals can be connected to capacitor array 1408 and inductor 1404. In addition, inductor 1404 can further be connected to an antenna element 1412, such as a side-coupling antenna element made out of bended sheet metal, where the side-coupling antenna element can also be mounted onto the edge of circuit laminate material 1410.

Figure 15A:
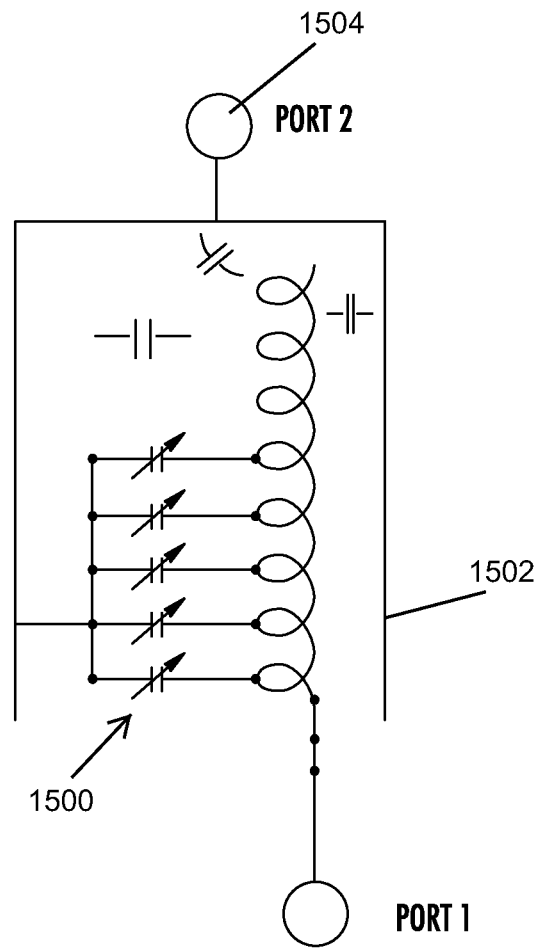
FIGS. 15A and 15B are exemplary configurations of tunable helical resonators according various embodiments of the presently disclosed subject matter.
Figure 15B:
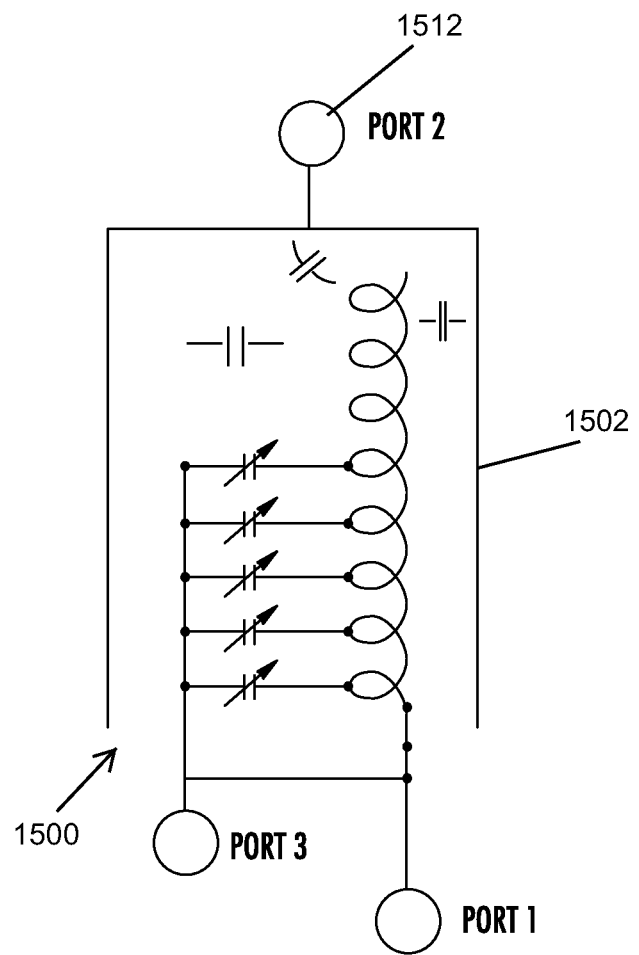

In some embodiments, inductance tuning systems as described here can be conveniently utilized as a part of a helical resonator. For example, inductance tuning systems as described in FIG. 1 and FIGS. 4A to 4C can be encapsulated with a square or cylindrical conductive shield and effectively function as a tunable helical resonator with high Q factors. Specifically, for example, FIGS. 15A and 15B are exemplary configurations of tunable helical resonators according to embodiments of presently disclosed subject matter. As illustrated in FIG. 15A, an inductance tuning system 1500 similar to the system described in FIG. 4B can be shielded with a substantially rectangular-shaped conductive shield 1502, where a feed terminal 1504 of system 1500 can be directly tied to shield 1502. Alternatively, FIG. 15B illustrates an inductance tuning system 1510 that is similar to the system described in FIG. 4A being shielded with conductive shield 1502, where system 1510 can have a feed terminal 1512 capacitively coupled to shield 1502.

Figure 16A:
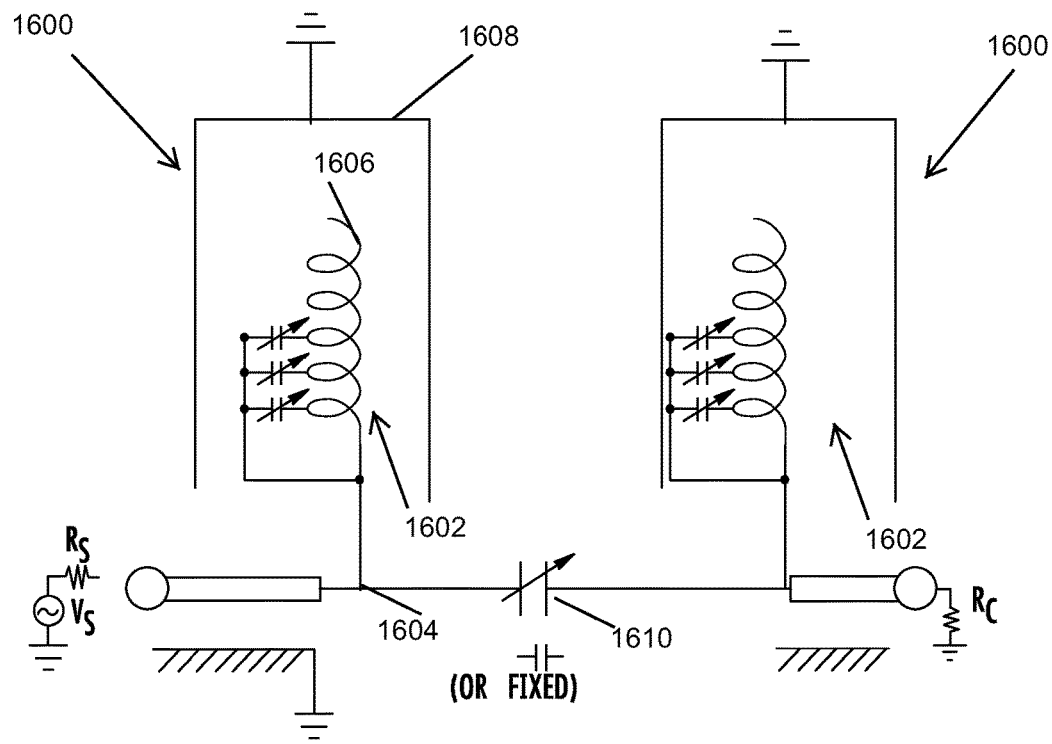
FIGS. 16A to 19B are exemplary implementations of tunable helical resonators according various embodiments of the presently disclosed subject matter.
Figure 16B:
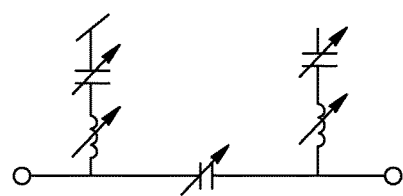
Figure 17A:
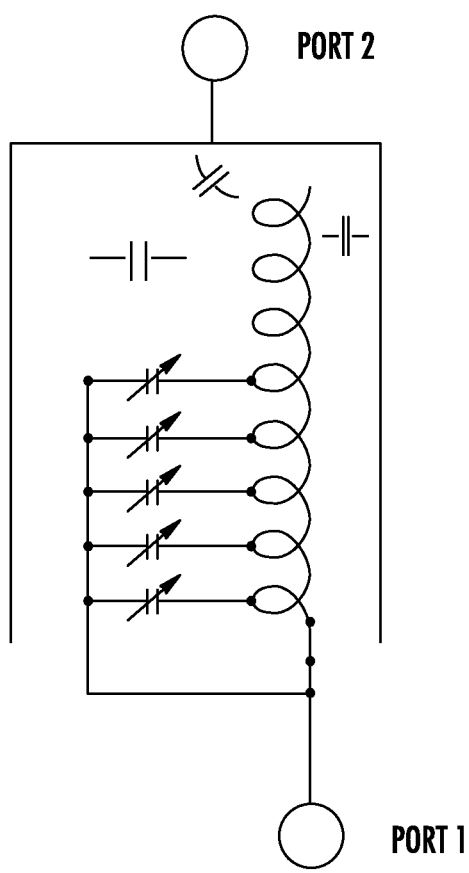
Figure 17B:
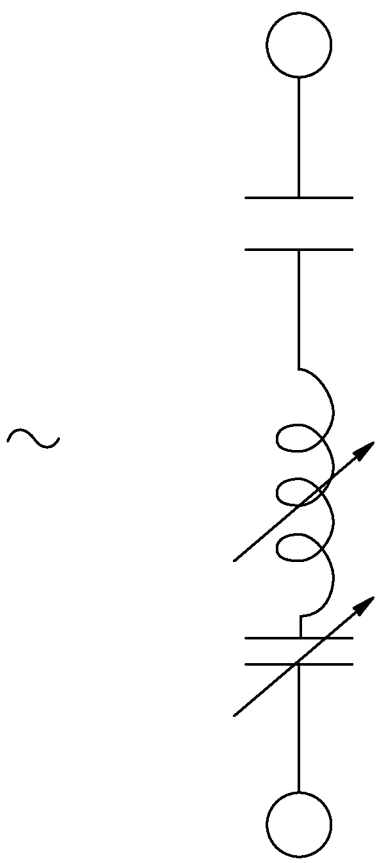

FIGS. 16A to 19B are exemplary implementations of tunable helical resonators according to embodiments of presently disclosed subject matter. FIG. 16A illustrates a filter created by means of two tunable helical resonators 1600 coupled together where each resonator 1600 can include an inductance tuning system 1602 shielded with a square shaped conductive shielding 1608. In some embodiments, a first feed terminal 1604 of inductance tuning system 1602 can be tied to a signal feed and connected to a capacitor 1610, while a second feed terminal 1606 can be capacitively coupled to shield 1608 and tied to ground. FIG. 16B illustrates a circuit equivalent of the implementation described in FIG. 16A and FIGS. 17A and 17B illustrate resonator 1600 and its simplified circuit equivalent.

Figure 18A:
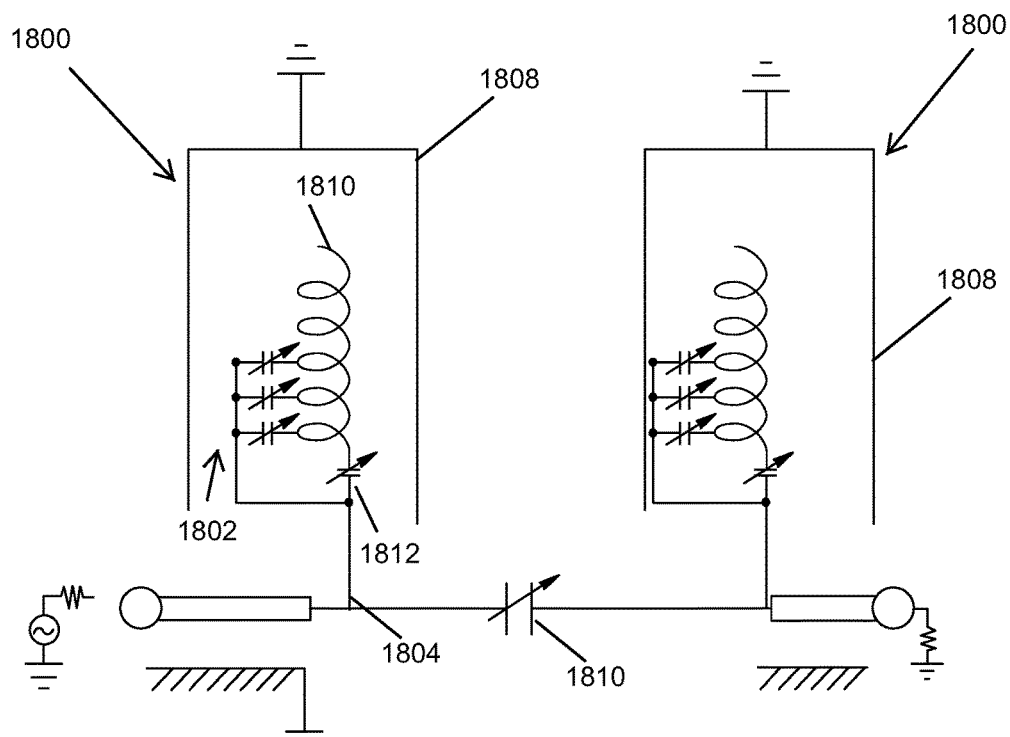
Figure 18B:
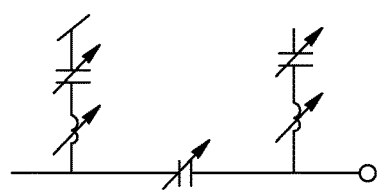
Figure 19A:
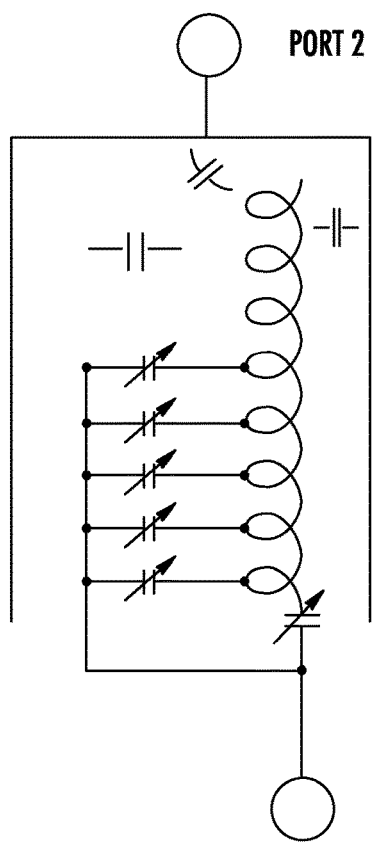
Figure 19B:
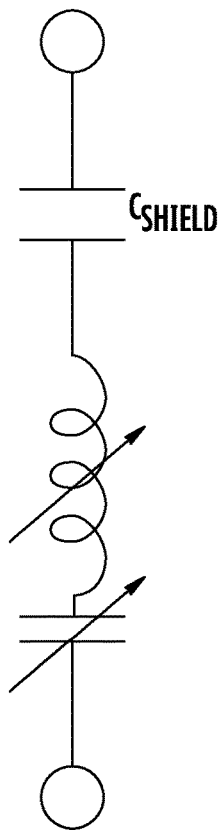

FIG. 18A illustrates two tunable helical resonators 1800 coupled together where each resonator 1800 can include an inductance tuning system 1802 shielded with a substantially rectangular shaped conductive shielding 1808. Similar to the implementation described in FIG. 16A, a first feed terminal 1804 of inductance tuning system 1802 can be tied to a signal feed and further connected to a capacitor 1812, while a second feed terminal 1810 can be capacitively coupled to shield 1808 and tied to ground. Furthermore, a variable capacitor 1812 can be tied to first feed terminal 1804 for adjusting the signal feed into system 1802. FIG. 18B illustrates a circuit equivalent of the implementation described in FIG. 18A and FIGS. 19A and 19B illustrate resonator 1800 and its simplified circuit equivalent.

Figure 20:
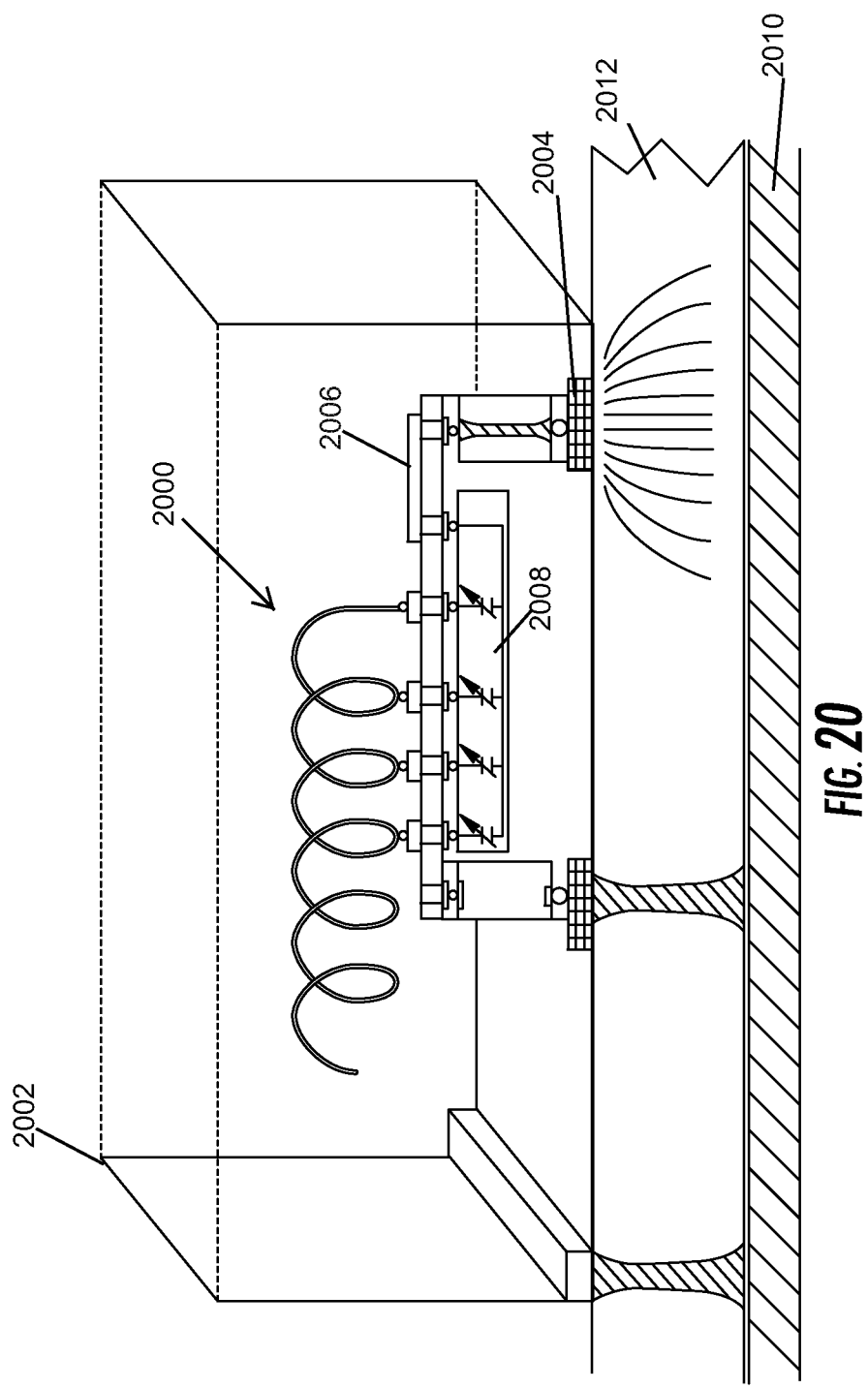
FIG. 20 illustrates an exemplary implementation of a tunable helical resonator mounted onto a PCB substrate according various embodiments of the presently disclosed subject matter.

FIG. 20 illustrates an exemplary implementation of a tunable helical resonator mounted onto a PCB substrate according to embodiments of the presently disclosed subject matter. As illustrated in FIG. 20, a tunable inductance system 2000 similar to the one described in FIG. 11 can be encapsulated with a substantially rectangular shape conductive shield 2002 and function as a tunable helical resonator. A first signal feed terminal 2006 can be tied to capacitor array 2008, where capacitor array 2008 can include a plurality of variable capacitors and encapsulated in a flip chip (FC) ball grid array (BGA) cavity. First signal feed terminal 2006 can be further connected to a signal transmission line 2004 for receiving control signals. In addition to improved device performance (e.g., high Q) and reliability, such configuration can also be easily integrated with other circuit components The present subject matter can be embodied in other forms without departure from the spirit and essential characteristics thereof. The embodiments described therefore are to be considered in all respects as illustrative and not restrictive. Although the present subject matter has been described in terms of certain preferred embodiments, other embodiments that are apparent to those of ordinary skill in the art are also within the scope of the present subject matter.

What is claimed is:

1. An inductance tuning system comprising:
a multi-turn inductor connected between a first terminal and a second terminal, the multi-turn inductor comprising of a plurality of inductive elements, wherein each of the plurality of inductive elements comprises a turn of the multi-turn inductor, wherein a spacing between adjacent turns of the multi-turn inductor is substantially less than an effective diameter of each turn, and wherein the adjacent turns are magnetically coupled to each other; and
a plurality of variable capacitors connected to the multi-turn inductor, each of the plurality of variable capacitors being discretely connected at one end to a tapped output associated with a node connecting two of the plurality of inductive elements and at a second end to a third terminal;
wherein each of the plurality of variable capacitors is a tunable capacitor that is individually tunable to adjust an impedance value of the inductance tuning system between the first terminal and the second terminal.

2. The system of claim 1, wherein the first terminal of the multi-turn inductor is in communication with at least one reactive element.

3. The system of claim 1, wherein a one of the plurality of capacitors that is connected to the one of the plurality of inductive elements that is closest to the first terminal is tuned to a highest capacitance value among the plurality of capacitors connected to the multi-turn inductor, wherein the multi-turn inductor exhibits a low effective inductance value for high frequency operations.

4. The system of claim 1, wherein a one of the plurality of capacitors that is connected to the one of the plurality of inductive elements that is furthest away from the first terminal is tuned to the highest capacitance value among the plurality of capacitors connected to the multi-turn inductor, wherein the multi-turn inductor exhibits a high effective inductance value for low frequency operations.

5. The system of claim 1, wherein the multi-turn inductor is fabricated via a single piece of wound wire of conductive material.

6. The system of claim 1, wherein the plurality of inductive elements comprises a plurality of SMD inductors.

7. The system of claim 6, wherein the plurality of SMD inductors are connected in a series arrangement; and
wherein at least one tunable capacitor is connected to a node between two of the plurality of SMD inductors.

8. The system of claim 1, comprising at least one shielding element that encapsulates the at least one inductor and the at least one capacitor.

9. The system of claim 8, wherein the shielding element is connected to a ground.

10. The system of claim 1, comprising a non-conductive laminate layer positioned between a first conductive laminate layer and a second conductive laminate layer; and
at least one conductive via connecting the first conductive laminate layer and the second conductive laminate layer through the non-conductive laminate layer.

11. The system of claim 10, wherein each of the plurality of inductive elements of the inductor is connected to one of the first conductive laminate layer or the second conductive laminate layer.

12. The system of claim 11, wherein each of the plurality of inductive elements of the inductor is connected to one of the first conductive laminate layer or the second conductive laminate layer by one of soldering, bonding, or welding.

13. The system of claim 10, wherein the inductor and the capacitor are each connected to one of the first conductive laminate layer or the second conductive laminate layer.

14. The system of claim 10, wherein the inductor is connected to one of the first conductive laminate layer or the second conductive laminate layer and is surrounded by circuit board elements on at least two sides.

15. The system of claim 1, wherein each tunable capacitor is configured to be individually tunable using one of electro-mechanical-actuation, electric field actuation, or operation of electrical semiconductor switches connected to an array of capacitances.

* * * * *